United States Patent [19]
Aharon et al.

[11] Patent Number: 5,202,889
[45] Date of Patent: Apr. 13, 1993

[54] DYNAMIC PROCESS FOR THE GENERATION OF BIASED PSEUDO-RANDOM TEST PATTERNS FOR THE FUNCTIONAL VERIFICATION OF HARDWARE DESIGNS

[75] Inventors: Aharon Aharon, Doar Na Misgav; Ayal Bar-David, Haifa; Raanan Gewirtzman, Haifa; Emanuel Gofman, Haifa; Moshe Leibowitz, Haifa; Victor Shwartzburd, Haifa, all of Israel

[73] Assignee: International Business Machines Corporation, Armonk, N.Y.

[21] Appl. No.: 612,349

[22] Filed: Nov. 13, 1990

[30] Foreign Application Priority Data

Apr. 18, 1990 [IL] Israel ......................................... 094115

[51] Int. Cl.$^5$ ............................................ G01R 31/28
[52] U.S. Cl. .................................... 371/27; 371/25.1; 371/223; 364/488; 364/578
[58] Field of Search ......................... 371/27, 20.4, 21.3, 371/24, 5.2, 22.3, 25.1; 364/488, 578

[56] References Cited

U.S. PATENT DOCUMENTS

| | | | |
|---|---|---|---|
| 4,594,711 | 6/1986 | Thatte | 371/25.1 |
| 4,718,065 | 1/1988 | Boyle et al. | 371/25.1 |
| 4,745,355 | 5/1988 | Eichelberger et al. | 371/22.3 |
| 4,782,487 | 11/1988 | Smelser | 371/27 |
| 4,801,870 | 1/1989 | Eichelberger et al. | 371/22.3 |
| 4,817,093 | 3/1989 | Jacobs et al. | 371/25.1 |
| 4,870,346 | 9/1989 | Mydill et al. | 371/27 |
| 4,945,536 | 7/1990 | Hancu | 371/22.3 |

FOREIGN PATENT DOCUMENTS 0149048 11/1984 European Pat. Off. .

OTHER PUBLICATIONS

H. D. Schnurmann, The Weighted Random Test-Pattern Generator, Jul. 1975, pp. 695–700.
H. J. Wunderlich, Self Test Using Unequiprobable Random Patterns, Digest of Papers, 17th Int'l Symp. on Fault-Tolerant Computing, Jul. 1987, pp. 258–263.
S. Tran, et al., "A VLSI Design Verification Strategy," IBM J. Res. Develop., vol. 26, No. 4, Jul. 1982, pp. 475–484.

Primary Examiner—Robert W. Beausoliel, Jr.
Assistant Examiner—Dieu-Minh Le
Attorney, Agent, or Firm—Henri Daniel Schnurmann

[57] ABSTRACT

In the dynamic process for the generation of biased pseudo-random test patterns for the functional verification of integrated circuit designs, the verification is performed in a sequence of steps, with each test pattern providing all data required to test a circuit design during at least one of said steps. Generation of each step is performed in two stages, where in a first stage all facilities and parameters required for the execution of the respective step are defined and assigned the proper values, and where in a second stage the execution of the particular step is performed. This process is continued until a test pattern with the number of steps requested by the user is generated, so that finally the test pattern comprises three parts: The initialized facilities define the initial machine state and execution parts of the test pattern, and the values of the facilities which have been changed during the execution of the steps, form the results part of the test pattern.

12 Claims, 4 Drawing Sheets

FIG. 1

| FIG. 1A |
|---------|
| FIG. 1B |

FIG. 1A

```
* Title:    Arithmetic and logic instructions test
* Comment:  Every instruction is executed with a specific opcode
* Number of Tests:  1; Instructions per Test: 8; Given Opcoders:
*   1 ADD Eb,Gb    2 XOR Ev,Gv    3 ADC AL,Ib    4 OR Eb,Gb    5 SUB
*   6 SBB eAX,Iv   7 CMP          8 AND Ev,Ib
*
* — — — — — Start a new test program — — — — — — — — —
*
H 10000 Rseed; 607084700 File: DEMO 1; OpCord: C; New_Reg: 0=  Last= 0;
*
R  EIP         <000229A0>
R  CR0         <00000001>
R  EFLAGS      <000008D2>
R  EAX         <3EF09C19>
R  ECX         <268795F7>
R  EDX         <81C0DDB5>
R  EBX         <D4234971>
R  EBP         <B24406B6>
R  ESI         <4FFDCB00>
*  GDTR                      Base            Limit
R  GDTR                      <00000000>      <0000FFFF>
*  LDTR        Selector      Base            Limit           Attributes
R  LDTR        <5898>        <00010000>      <0000FFFF>      <4082>
D  00005898    <0000FFFF>                    * GDT ENTRY: 8 BYTES
D  0000589C    <00408201>
*  CS          Selector      Base            Limit           Attributes
R  CS          <9B2C>        <00020000>      <0005FFF0>      <409B>
D  00019B28    <0000FFF0>                    * LDT ENTRY: 8 BYTES
D  00019B2C    <00459B02>
*  DS          Selector      Base            Limit           Attributes
R  DS          <5878>        <00080000>      <0007FFFC>      <4093>
D  00005878    <0000FFFC>                    * GDT ENTRY: 8 BYTES
D  0000587C    <00479308>
*
```

```
*      ———————      Assembly Program      ——————————
*
I  000429A0   <00F9>              *  <1>   L=2   ADD  CL,BH
I  000429A2   <31CE>              *  <2>   L=2   XOR  ESI,ECX
I  000429A4   <1488>              *  <3>   L=2   ADC  AL,88h
D  00084001   <D9>
I  000429A6   <676608BE4B39>      *  <4>   L=6   OR   {BP+394Bh} ,BH
D  000B4EEE   <52E0>
I  000429AC   <6629B2755ACAAB>    *  <5>   L=7   SUB  {EDX+ABCA5A75h} , SI
I  000429B3   <661DA460>          *  <6>   L=4   SBB  AX, 60A4h
I  000429B7   <38F4>              *  <7>   L=2   CMP  AH,DH
D  0008A7E3   <9D79>
I  000429B9   <676683603215>      *  <8>   L=6   AND  {BX+SI+32h} , 15h
*
RESULTS                              * Instructions Generated <8>
*
R  EIP        <000229BF>
R  CR0        <00000001>
D  00084001   <D9>
D  000B4EEE   <F4A0>
D  0008A7E3   <0011>
R  EAX        <3EF03BFC>
R  ECX        <26879540>
R  ESI        <697A5E40>
R  EFLAGS     <00000016>
```

FIG. 1B

DYNAMIC PROCESS FOR THE GENERATION OF BIASED PSEUDO-RANDOM TEST PATTERNS FOR THE FUNCTIONAL VERIFICATION OF HARDWARE DESIGNS

DESCRIPTION

The invention relates to a process for generating test patterns for the functional verification of integrated circuit hardware designs. In this connection, "verification" means establishing a functional equivalence between the design specification and its logic realization. In other words, the invention is directed to a method for providing a technical means for checking the logic of an integrated circuit, but the verification of the physical conditions of the circuits, though very important, too, is not within the scope of the invention, i.e., for the purposes of this invention, it is assumed that the implementation of the logic hardware is done without errors.

In particular, the invention is directed to the principles of creation of a dynamic biased pseudo-random test pattern generator (RTPG) for the functional verification of hardware designs, the term "Generator" being used here, as in the relevant literature, to stand for an algorithm that can produce a significant amount of data, much like the well known "random number generators," and the term "Test Pattern" means a particular set of bits, provided in a certain order. As will be known to those skilled in the art, a set of test patterns is required to test a circuit of more than the most trivial design, and the pattern generator is employed in the generator of the test patterns of a set.

The verification of modern circuit designs, especially that of large designs, such as a processor or an entire computer system, takes the greater part of the resources during a design process. Design verification is considered to be a bottleneck, which has a great impact on the design cycle.

Strictly speaking, the equivalence between what the design is supposed to do and what is actually doing, can be proved only by formal verification (formal proof of correctness) or exhaustive simulation (exhaustive testing). The current state of formal verification techniques does not allow their usage for large designs. Besides this, the design specifications are usually written in natural languages, to which formal techniques cannot be directly applied.

Exhaustive simulation is also impossible for modern designs because of the huge number of test scenarios which would have to be simulated. Thus, in practice, the design verification is done by the simulation of a relatively small set (as compared to exhaustive simulation) of selected test scenarios. The main burden here is in writing the test scenarios and ensuring their appropriateness and quality.

To verify a design, in this approach, one needs to:
write executable test scenarios that include expected results,
simulate these test scenarios against a software or a hardware design model,
compare the expected results with the actual results, obtained from the simulation,
evaluate the appropriateness and quality of the test scenarios using "coverage analysis."

The term "Coverage Analysis" is closely related to the appropriateness and quality criterion mentioned above: It is intended to provide information on whether all situations mentioned in the specification of a particular circuit and which that circuit is supposed to cope with, such as instruction handling, overflow, underflow, interrupts, etc., are appropriately "covered" by the scenarios selected.

The steps listed above are iterated until a predefined quality level of the verification process is achieved. The process is usually carried out by designers and test engineers. A designer is intimately familiar with his part of the design and the type of test patterns he wants to apply for its verification.

But his knowledge of the environment in which the test patterns should be written might be limited. A test engineer, on the other hand, has better experience in writing test patterns, but he is not familiar enough with the design details and might overlook certain situations which should be verified. But for both of them, writing test patterns is very tedious, not productive and prone to errors.

The effort required for manually setting the initial state of a machine and predicting the expected results is acceptable only when very short test patterns with simple actions are involved. However, when complicated test patterns are necessary for the verification process, such as for verification of the pipeline mechanism of a processor, virtual address translation, or the handling of interrupts, for example, the required manual effort is unacceptable.

Prior to this invention, designers and test engineers wrote test patterns for design verification manually, where the support provided by software tools was very limited, helping mainly in the prediction of expected results of complex arithmetic instructions, e.g., in floating point operations.

An automatic approach to pseudo-random test pattern generation for processors has become known from A. S. Tran, R. A. Forsberg and J. C. Lee, "A VLSI Design Verification Strategy," IBM Journal of Research and Development, Vol. 26, No. 4, Jul. 1982, pp. 475-484. The test patterns generated in accordance with conventional methods are machine code executable programs. These test programs are assembled from instructions, control flags and data selected from especially prepared tables. To get the expected results, the assembled test programs are simulated against an existing hardware or software model under driver control. These drivers can change the conditions with which the test programs are executed, e.g. processor priority level, memory addressing mode, etc..

Such an approach to the test development process might be characterized as a static one, because the test patterns are assembled first, and are then simulated to get the expected results. The test pattern development process is not influenced by the intermediate machine states during the execution of a test.

The static approach is much more productive than the manual writing of test cases. Its major drawback, however, besides requiring the writing of many tables and drivers, is a lot of restrictions which the generated instructions should obey. These restrictions considerably reduce the space in which the test patterns can be generated. For example:

A general purpose register which is a destination register of an arithmetic instruction, cannot be used as a base register in a storage access instruction, otherwise the instruction refers to an undefined memory location.

Only branch-forward instructions are generated to avoid creating endless loops within the test. Furthermore, the forward-branch offset is random, and the gap between the branch instruction and its target should be filled with instructions which are never executed. This imposes small offsets in branch instructions.

Instruction sequences should be carefully prepared to avoid undesirable behavior of a test. Some of these instructions are always preceded by a specially inserted instruction for data initialization. Thus, there are sequences of instructions which cannot be generated.

Also known, from EP-A-0 149 048, is a method for testing semiconductor devices. In this reference, an array testing apparatus including a plurality of pin pattern generators is provided for individually generating serial bit sequences required at each pin of the device under test during testing. The individual pin pattern generators receive starting addresses from one or more programmable controllers, and each pin pattern generator then performs a subroutine to repeat basic patterns or combinations of basic patterns as necessary. Both the pin pattern generators and the programmable controllers may include loop logic for obtaining the desired repetition sequences. Obviously, this technique is applicable only to hardware embodiments and not to a design stage of semiconductor device.

It is an object of the present invention to overcome the drawbacks of the conventional static approach to test pattern generation.

It is another object of this invention to provide a hardware verification process which permits its user (a designer and/or test engineer) to control the test pattern generation up to any required degree —from complete or partial specification of test patterns to completely automatic test pattern generation.

It is also an object of this invention to relieve its user, while generating test patterns, from:
initialization of required facilities (primary inputs, registers, memory elements and storage locations) which influence explicitly or implicitly the execution of the generated test pattern;
tracing and marking of all facilities which undergo changes during the execution of the generated test pattern, and their comparison against the simulation results;
calculating of the test case's expected results.

It is also an object of this invention to permit its user to generate test patterns for verification of a processor or entire computer system without detailed knowledge of the processor assembly language.

It is still another object of this invention to define a test pattern generation process, which ensures high quality of the generated test patterns. The quality is guaranteed by evaluating the generated test patterns and fixing the biasing functions in such a way that every part of the design is exercised (tested) with a reasonable probability, thus obtaining appropriate "coverage."

Accordingly, the invention relates to a dynamic process for generating biased pseudo-random test patterns for the functional verification of integrated circuit designs, where the verification is performed by executing the said test patterns on the design model in a sequence of steps, and where each test pattern provides all data required to test a circuit design during at least one of said steps. The method of the invention is characterized in that generation of each step in the said test pattern is performed in two stages, whereby in said first stage all facilities and parameters required for the execution of the respective step are defined and assigned the proper values, and whereby in said second stage the execution of the particular step is performed, that this process is continued until a test pattern with the number of steps requested by the user is generated, so that upon completion of the generation, a test pattern is created where the initialized facilities define the initial machine state and the execution parts of the test pattern, and where the values of the facilities, which have been changed during the execution of the steps, form the expected results part of the test pattern.

Details of a preferred version of the process of this invention will now be described by a way of example with reference to the accompanying drawings in which:

FIG. 1A and FIG. 1B are a printout of a typical test pattern generated in accordance with the invention:

Figure 2:
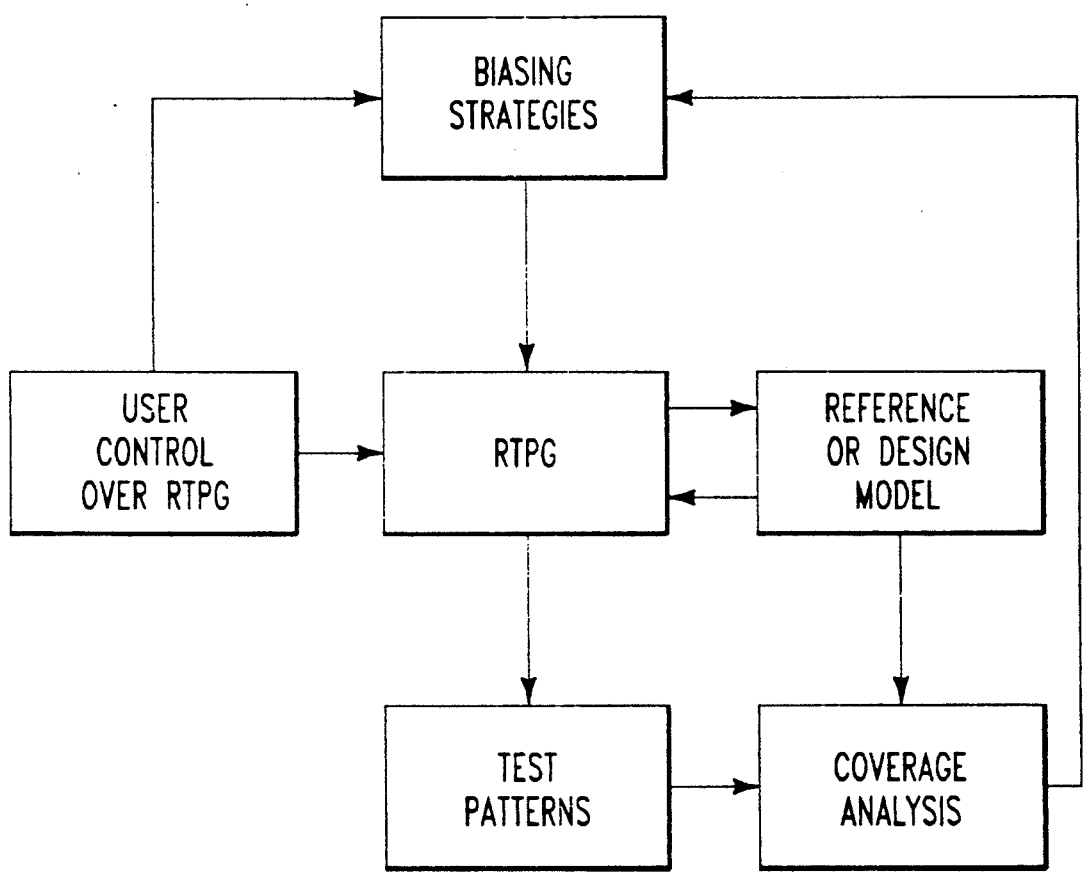
FIG. 2 is a simplified block diagram showing the general organization of the units involved in the dynamic generation of the biased pseudo-random test pattern.

Referring to FIG. 1, there is shown a test pattern in the form of a short program for testing a microprocessor. This program contains comments explaining its purpose, disassembling of the instructions for readability, starting seed for the random number generator and other externally provided initial conditions to regenerate the program when required (e.g. in case of minor changes in the architecture), and hooks for handling the test pattern in the test library.

In particular, the R (register) card specifies the register name and initial value, the I (instruction) and D (data) cards define real memory addresses and their contents. The I cards also include the corresponding assembly code. The I and D cards are essentially the same and have different tags for readability only.

Generally, the test patterns produced in accordance with the invention consist of three parts:
1. Initialization, which before a test actually starts, defines values of all facilities involved in the test up to certain states as required by the test pattern. Only those facilities which have explicit or implicit influence on the execution of the test are to be initialized.
2. Execution, which drives the simulation of the design during one or more steps (e.g. machine cycles). In certain cases the execution part might be included in the initialization part. For example, if the design relates to a processor, the execution part can be specified by proper initialization of the instruction memory, instruction address register and termination point.
3. Result, which provides the final values of the facilities which have been changed during execution of the test.

The dynamic nature of the test pattern generation process in accordance with the invention might be described shortly as follows: The generation of every step consists of two stages, viz. the definition of all machine facilities involved in the respective step, and the execution of the step. At any given moment, a facility may be either free, which means that it either represents a primary input or no value has been assigned to it yet, or it may have had a value assigned to it by the initialization part of the process, or during the execution of one of the previous steps.

All facilities involved in the execution of a step are inspected, and those of them which are free, are initialized. The initialization is performed in accordance with information provided by the user or in conformity with available biasing strategies. The starting set of the strategies is defined in conformity with the user's experience and his knowledge of the design. Usually, it is not sufficient to cover all situations envisioned in the specification. To identify any "holes," coverage analysis is used. The starting set is then appropriately upgraded, and more strategies are added to cover those "holes."

The final set of the strategies should ensure generation of test patterns which have a reasonable probability of covering every design block. The coverage analysis can be performed on an architectural (reference) model of the design as well as on the design itself. Usually, architectural models are written in high level languages and are available much earlier than the designs. The test patterns generated with architectural model-based biasing are used as the first verification test set for the design.

When the process ensures that all the required facilities have values, the step is executed and all facilities affected by this execution are updated. Thus, at the beginning of the next step, the generation process "knows" the state of all facilities. This feature eliminates the constraints of the existing test pattern generators, and overcomes the drawbacks of the static test generation.

After the required number of steps has been generated, the facilities which have been initialized (except primary inputs) present the initial state of the design and define the initialization part of the test pattern. Those of them which were changed during the execution part of the process, define the final state of the design. The latter provide a minimal set of expected results for a test pattern. The values of primary inputs, step by step, define the execution part of the test pattern. The intermediate values of primary outputs might be collected and included in the expected results of the test pattern. The description that follows will be tuned to the system chosen as an example, but it will be apparent to those skilled in the art that the same approach is valid for any arbitrary design which requires the generation of test patterns for its verification. The test pattern definition is almost straightforward for a computer system: The most natural way is to make the pattern close to the assembly language used by the central processing unit (CPU). In addition to processor instructions, the pattern might contain the following:

Direct specification of the machine facilities for both, initialization and expected results. The direct initialization of the facilities, instead of the creation of a corresponding assembly code, simplifies the test pattern generation process and saves simulation cycles.

Specification of events which cannot be described by the assembly code, e.g. external interrupts.

Providing hints to the simulation program.

The "direct specification" mentioned above is contained in the test pattern of FIG. 1: The R-cards specify the values of registers, D-cards those of memories, etc., where the cards above "RESULTS" represent initial values, and the cards below "RESULTS" represent expected results. These cards are interpreted by the simulation program which assigns the respective values directly to the registers, memories and other facilities concerned prior to starting the simulation, and which compares the provided results with the values the facilities have assumed after the simulation of the test pattern has been completed.

Figure 3:
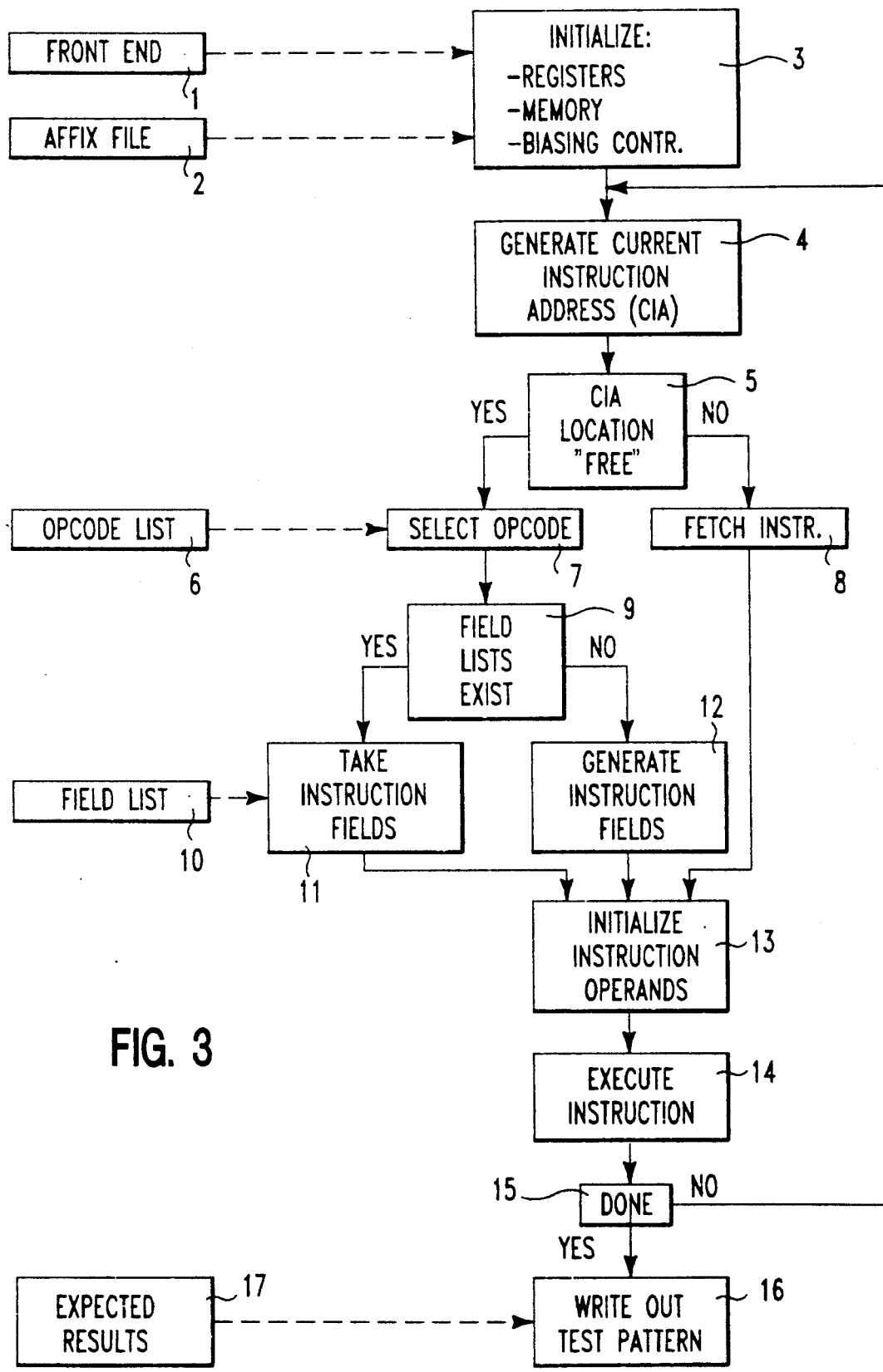
FIG. 3 is a flow chart showing a realization of the process of the invention for generating a test pattern for testing the design of a computer system.

FIG. 2 is a schematic representation of the data flow in the pseudo-random test pattern generation process and FIG. 3 is a flow chart showing an RTPG realization for a computer system. The user controls the process at the front end (block 1 in FIG. 3), which is implemented as a set of screens allowing the initialization of the most crucial parameters of the process. Usually, these parameters control the selection among biasing strategies, set the contents of the machine state register, set the memory limits, etc. particularly, the initialization step comprises a sequence of substeps which includes: feeding the basic parameters which control the first stage; defining and setting all the facilities which are involved by: a) selecting the appropriate biasing strategy, b) setting the contents of the machine state register, and c) defining the memory limits; generating the current instruction address; checking the addressed memory location for completed definition, and if so, indicating that it is "free", and if not, fetching an instruction from storage; beginning the generation of the instruction by selecting an opcode from an opcode list and building an instruction word consisting of fields from either a field list or from the biasing strategy and, finally, assigning to all operands their respective values based on the biasing strategy. The data in the screens may be saved to allow, when required, the regeneration of the test patterns instead of storing them.

The possibility to regenerate test patterns is desirable, e.g., for regression testing which is necessarily performed after changes in the design model were made, in order to ensure that no new problems were created by these changes. The storing of the control parameters of a test pattern requires by far less storage space than the storing of the entire test pattern. However, the regeneration of the test pattern from the stored control parameters takes computer time.

For ease of use, the screens provide control only over a limited number of parameters. If the user needs more control than is provided by the screens, the additional control is achieved by using an AFFIX file in block 2 in FIG. 3. The AFFIX file has the same format as the initialization part of a test case, and allows the initialization of any facility in the design. As a matter of fact, the AFFIX file may contain a program, written in assembly language, or interrupt handling routines. The AFFIX file is also used to provide some controls over the RTPG process, which are very specific and, thus, not required by all users. Accordingly, there is no reason to include them in the front end screens.

The following description and block numbers are related to the FIG. 3. The dotted lines from blocks 1 and 2 (as well as from blocks 6, 10 and 17) mean that these blocks are optional: There are default values (selected randomly by a set of built-in biasing strategies) for all control parameters, which have not been specified by the user.

The initialization procedure of block 3 is performed as follows: Data from the front end screens and from an AFFIX file—provided—are used to set the specified facilities. All other facilities are declared "free/" If a "free" facility is going to be used as a source or has an implicit influence on the instruction under generation, it is initialized by RTPG. There is no need in more complex initialization (like IPL), since the generated test patterns are self-defined. This means that every test initializes all facilities required for its execution.

In block 4, the address of the current instruction is generated. The process might be as simple as taking the contents of the Instruction Address Register (Program Counter), or might be much more complicated when a translation to virtual and physical address is required. In the last case, all registers involved in the address translation and all corresponding entries in intermediate tables (e.g. page frame table) are initialized by RTPG. Again, the user-requested biasing drives this process, and, for example, the setup for any requested or randomly selected type of a page fault may be created here by proper initialization.

When the address of a current instruction is known, RTPG checks whether the memory location corresponding to this address is "free." If so, the RTPG process branches to block 7 where the instruction generation begins. Otherwise, the instruction is fetched from storage (block 8), its operands are initialized (block 13) and the instruction is executed (block 14). Although the fetched instruction might turn out to be invalid, —and actions for invalid instruction handling are well defined, —it might be executed. Otherwise, RTPG supports some recovery procedures where, in the worst case, the generation of the test pattern may be stopped.

The instruction opcode selection is the most important feature to control the test pattern generation process. The list of possible opcodes is, of course, defined by the design specification. Selection of a proper subset of instructions enables use of RTPG from the very beginning of the design process, i.e., when not all instructions are supported yet. If the design is comprised of several units (e.g. fixed point unit, floating point unit, etc.), the test patterns might be created separately for every unit and run against the unit model. This simplifies debugging and reduces the simulation time. If no subset of instructions is selected by the user, the process will use the entire list.

The opcode list contains instruction mnemonics as they are defined by the design specification. If required, the list of mnemonics may be further extended to provide better control of the RTPG. For example, an ADD instruction can be represented as ADD_RR for the register-register version, and as ADD_RM for the register-memory one. For a given list of opcodes, several biasing strategies are available:

Random selection.

Sequential selection from a given list. This is important when the user is interested in creating a specific sequence of instructions.

Selection of an instruction, in which its source operand was a destination of the previous instruction. For example, if the current instruction changes the condition register, the branch on a changed bit of the conditional register has a high probability of being selected as the very next instruction.

Following the selection of the opcode, the instruction word is built. The field list of block 10—if provided—is used to set the instruction fields. Some of them may be defined in the list, otherwise they may be requested to be generated randomly. The field list option used together with sequential selection of instructions from the Opcode List of block 6 allows the assembling of test patterns up to any required degree of control and provides the same capabilities as writing test patterns in free format assembly language, but in a much easier way. Easier, because the user must not worry about specifying all involved facilities: If he forgot any, that facility would be initialized by the RTPG process.

If the user did not provide a Field List, the instruction fields would be generated by the RTPG process in accordance with specified biasing strategies. For example, if a field contains a number of a general purpose register, the number is selected by one of the following rules, which were set in block 3.

Selection of a "free" register. In this case, the RTPG has a freedom in data assignment to the register. Also the result of the instruction will not be overridden by subsequent instructions. Only relatively short test patterns can be generated when this option is used.

Random selection. A register is selected randomly with biasing toward increasing the probability to use the same register more than once in the same instruction, preventing the use of a register as a destination, if it has been used by previous instructions and if in its last use it was a destination. This feature increases the probability of propagation of an intermediate error to the expected results.

High probability exists to select the target register of a previous instruction as a source or target of the current one. This option is very important in the verification of the bypass logic as well as in the verification of synchronization between instructions when more than one instruction may be executed at once (so called superscalar execution).

The biasing of the register selection mentioned above is very important, especially for a RISC type architecture, where a large number of registers is available, and where three or four registers may be used in one single instruction.

If an instruction contains immediate fields, i.e. fields holding the respective value rather than an address where such value can be found, these fields are initialized in accordance with the biasing of the operand initialization. In block 13, all operands which participate in the instruction and have not been initialized yet, get their values. The biasing here is instruction-driver. For example, operands for add class instruction are generated such that long chains of carry propagation are created. When an address for data (load/store) or an instruction (branch) is generated, a high probability to get it close to a page boundary is provided. Many other biasing options inspired by implementation details may be incorporated here. These biasing options are checked against predefined testing techniques by the above-mentioned coverage analysis process, and are upgraded accordingly.

All facilities that have been set by the user or which have been initialized by the RTPG process during instruction generation, define the initial machine state and environment conditions for the test pattern.

In block 14, the instruction is executed. To do this, a reference model should be employed by the RTPG process. After the execution of the instruction, all involved facilities are updated. These facilities are marked as containing the test pattern result: Their state after completion of the test pattern provides the expected results. When it is in debug mode (a front end option) after every executed instruction, the RTPG process provides the user with the intermediate state of all facilities changed by the instruction. This feature is very helpful, especially in the debugging of complex test patterns.

If more instructions should be generated, the process goes to block 4. Otherwise, the generation of a test pattern is completed. The results obtained during the generation are compared against externally provided expected results in block 17, if such option was employed by the user. This option is valuable when the RTPG process is used as a reference model to check and/or substitute the expected results in test patterns written manually or imported from other sources.

The last action of the RTPG process is presenting the generated test pattern in a user-readable format and as a text file which is used to simulate it in the design model.

The quality of the generated test patterns depends on the set of biasing strategies, implemented in the RTPG process. The starting set of the strategies is defined by the RTPG designer and depends on his experience and knowledge of the design specifications. For example, when generating the operands for a floating point add instruction, the biasing should ensure high probability of getting the exponents difference within the required range.

The test patterns generated using the initial set of biasing strategies are run against the reference model for coverage analysis (FIG. 2). The coverage is evaluated over selected testing techniques, the simplest of which is recording all legs in decision trees. Another simple testing technique which has proved to be very efficient in practice, is the skip-mutation fault model. Here, the original reference model is substituted by a faulty model, in which a single block is omitted. The fault is considered to be covered by the RTPG, if there exists a reasonable probability to generate a test pattern sensitive to this fault. If the probability to expose this fault is below a certain level, the biasing within the RTPG process is modified. As a result of this "tuning" of the RTPG process, the biasing strategies are improved and a relatively small set of test patterns may be collected, with 100% coverage (over selected testing techniques) of the reference model. This set of Architecture Verification Patterns is used as a starting set in the design verification and is called the AVP subset. The quality of the AVP subset is strongly related to the granularity of the reference model and to the testing techniques that are applied for its coverage analysis process. As the reference model is more detailed, and the reliability of the testing techniques is higher, the generated AVP subset is more comprehensive.

The final step in biasing evaluation is done during the coverage analysis of the actual design model. The basic steps here are the same as in the coverage analysis of the reference model, just the applied testing techniques might be different.

It might be helpful for the understanding of the invention to describe a short and simple example of the generation of a test pattern although a small example cannot represent the process and will be almost trivial. Consider a processor which consists only of three instructions—ADD, SUBTRACT and MULT and four registers. An instruction uses three registers: Two registers as the sources, and one register as a target. In the usual notation, "SUB 1, 2, 3" means to subtract the contents of register "3" from the contents of register "2," and to put the result in register "1."

Assuming we want to generate a test pattern with three instructions.

Step 1 (Instruction 1):

Stage 1.
  Select instruction: ADD
  Select source registers: "0" and "3."
  Are they free? Yes.
  Assign value: "53" and "11" (because of biasing of arithmetic data in order to get long carry propagations.)
  Mark registers "0" and "3" as those which have to be initialized.
  Are all required facilities defined? Yes.
  Select target register: "3."

Stage 2.
  Execute "53 + 11" and put the result "64" in register "3." Mark register "3" as keeping the result.

Step 2 (Instruction 2):

Stage 1.
  Select instruction: SUB
  Select source registers: "0" and "1."
  Are they free? No and Yes respectively.
  Assign value to register "1" : "7."
  Mark register "1" as one which has to be initialized.
  Using existing value of register "0" ("53").
  Are all required facilities defined? Yes.
  Select target register. Register "3" keeps results, thus try to choose any other, say register "2."

Stage 2.
  Execute "53 − 7" and put the result "46" in register "2."
  Mark register "2" as keeping the result.

Step 3 (Instruction 3):

Stage 1.
  Select instruction: ADD
  Select source registers: "3" and "0."
  Are they free? No.
  Use existing values.
  Are all required facilities defined? Yes.
  Select target register. Registers "2" and "3" keep results, but the result of Register "3" has been used (just now, in the current instruction), so it can be returned to the pool and any one of registers "0," "1," and "3" can be selected.
  Select register "3" as a target again.

Stage 2.
  Execute "53 + 64" and put the result "117" in register "3."
  Mark register "3" as keeping the result.

End of the generation process.

The test pattern will be written as follows:

R0 <53>
R1 <7>
R3 <11>
ADD 3, 0, 3
SUB 2, 0, 1
ADD 3, 3, 0
RESULT:
R2 <46>
R3 <117>
END

The same test on a real processor would, of course, be much more complicated because of a lot of control registers which should be defined (instruction pointer, masks, machine state register, etc.) and all kinds of memory tables, which should translate the instruction pointer to the real address where the instructions are located.

Now that this test pattern is complete, the coverage it provides remains to be checked, i.e. a trivial coverage model should check whether all instructions have been tried. We shall find that MULT was not generated. So, we have to generate more test patterns to have MULT checked. When checking coverage on the design model, we can find that some blocks of the adder (e.g. in the Carry Look Ahead logic) are not verified. In this case we have to run more relevant instructions, and, maybe, to improve biasing of their data to achieve a better coverage of the adder.

We claim:

1. Dynamic process for generating biased pseudo-random test patterns for the functional verification of an integrated circuit design, wherein the verification is performed in a sequence of steps defined by a user, and wherein each of the test patterns provides all data required to test the circuit design during at least one of said steps, said process comprising:
   a) performing each of said steps in a first and a second stage, wherein facilities and parameters required for executing said step are defined and initialized in said first stage, and wherein said step is executed in said second stage;
   b) repeating a) until the test pattern having the number of steps requested by the user is generated, and whereupon completion of said generation said test pattern comprises:
   the initialized facilities that define an initial machine state;
   the execution of the step that drives the simulation of said design; and
   final values of said facilities that incorporate changes that occurred during the execution of said steps to include expected results of said test pattern.

2. The process in accordance with claim 1, further comprising storing for later retrieval intermediate states of said facilities after executing each of said steps.

3. Process in accordance with claim 1 wherein the initialization of one of the facility in said first stage is performed if, and only if, the respective facility has not been set yet, and if it is used as a source in the currently generated step, or if it influences in any way the execution of the currently generated step.

4. Process in accordance with claim 1, wherein the execution of said patterns may occur in an arbitrary order.

5. Process in accordance with claim 1, wherein an assignment of values to said facilities is performed in accordance with biasing strategies defined by the user or selected randomly, said strategy is selected from a group that consists of: creating a specific sequence of instructions and selecting an instruction having a source operand, wherein said operand is a destination of a previous instruction.

6. Process in accordance with claim 5, wherein an initial set of said biasing strategies defined by the user is evaluated during coverage analysis of the test patterns generated thus far, said coverage analysis comparing a reference model of the design to an actual design model.

7. Process in accordance with claim 1, wherein every circuit comprising the design is tested at least once.

8. Process in accordance with claim 5, wherein within said biasing strategies, data is generated pseudo-randomly and control parameters of the process are stored so as to permit later regeneration of the generated test patterns.

9. Process in accordance with claim 1, wherein during execution of said step in said second stage, a reference model of the design is used, the model being incorporated as part of the process.

10. Process in accordance with claim 5, wherein the quality of the test patterns under generation is monitored by coverage analysis, said coverage analysis is being performed in accordance with testing techniques that include covering of branches and paths in a reference or design model, and wherein feedback from said coverage analysis is used for improving the biasing strategies and for evaluating the efficiency of said functional verification.

11. Process in accordance with claim 10, wherein said coverage analysis is initially performed on a reference model with the test patterns generated used as a starting set for the design verification, said verification process is subsequently followed by the coverage analysis being performed on the design model, wherein the patterns created are used as a basic set for regression testing.

12. Process in accordance with claim 5, wherein the initialization step comprises:
   feeding basic parameters which control said first stage;
   defining and setting the facilities involved by selecting said biasing strategy, setting the contents of a machine state register and defining the memory limits;
   generating a current instruction address;
   checking the addressed memory location for a completed definition and, if so, indicating that it is "free," and if not, fetching an instruction from storage;
   initiating the generation of an instruction by selecting an opcode from an opcode list and building an instruction word consisting of fields by using a field list or by using said biasing strategy;
   assigning to all operands their respective values based on said biasing strategy, and wherein
   said execution step comprises:
   executing the accessed instruction taking into account that all involved facilities have been set in the first stage,
   updating all affected facilities and their marking containing a test pattern result,
   determining whether sufficient steps have been generated as required by controls of the process, and
   if so, having obtained results compared with expected results, wherein after a generated test pattern is written out, and
   if not, the test pattern generation process is repeated until a required number of steps are obtained.

* * * * *